United States Patent [19]

Nakagome et al.

[11] 4,315,667
[45] Feb. 16, 1982

[54] FIBER FOR OPTICAL TRANSMISSION HAVING SINGLE CRYSTAL CORE

[75] Inventors: Yukio Nakagome, Yokohama; Yoshinori Mimura, Tokyo, both of Japan

[73] Assignee: Kokusai Denshin Denwa Kabushiki Kaisha, Japan

[21] Appl. No.: 19,168

[22] Filed: Mar. 9, 1979

[30] Foreign Application Priority Data

Mar. 20, 1978 [JP] Japan .................. 53-32123

[51] Int. Cl.³ .................................................. G02B 5/172
[52] U.S. Cl. .................................. 350/96.34; 23/304; 350/96.30
[58] Field of Search ............. 350/96.30, 96.31, 96.34, 350/96.29; 65/1, 2, 3 R, 3 A, 11 W; 23/295 R, 301, 304

[56] References Cited

U.S. PATENT DOCUMENTS

| | | | |
|---|---|---|---|
| 3,722,981 | 3/1973 | Pinnow et al. | 350/96.30 X |
| 3,981,818 | 9/1976 | Swinehart et al. | 23/304 X |
| 4,040,890 | 8/1977 | Burrus, Jr. et al. | 350/96.30 X |
| 4,077,699 | 3/1978 | Dyott et al. | 350/96.34 |
| 4,165,915 | 8/1979 | Rau et al. | 350/96.34 |

FOREIGN PATENT DOCUMENTS

| | | | |
|---|---|---|---|
| 2821642 | 11/1978 | Fed. Rep. of Germany | 350/96.30 |
| 2396981 | 2/1979 | France | 350/96.30 |

OTHER PUBLICATIONS

Pontarelli et al., "Infrared Fiber Optics", ASTIA Report AD-238 984, Jun. 14, 1960, pp. 1-10.
Lussier, "Guide to IR-Transmissive Materials", *Laser Focus*, vol. 12, No. 12, Dec. 1976, pp. 47-50.
Stevenson, "Growth and Characterisation of Single Crystal...", *Jour. Crystal Growth*, vol. 37, No. 2, Feb. 1977, pp. 116-128.
Burrus et al., "Growth of Single-Crystal...", *Applied Phys. Ltrs.*, vol. 31, No. 6, Sep. 1977, pp. 383-384.
Van Uitert et al., "$ZnCl_2$ Glass: A Potential...", *Applied Phys. Ltrs.*, vol. 33, No. 1, Jul. 1978, pp. 57-59.
Miyashita et al., "An Ultimate Low Loss Single Mode Fiber...", *Conf. on Opt. Fiber Commun.*, Washington, D.C., Mar. 1979, pp. PD1-1-PD1-4.

Primary Examiner—John D. Lee
Attorney, Agent, or Firm—Robert E. Burns; Emmanuel J. Lobato; Bruce L. Adams

[57] ABSTRACT

A fiber for optical transmission, in which a core thereof for propagating light is formed of a single crystal of an ionic substance except positive ions having no closed cell electronic structure and positive ions of strong covalency. The ionic substance is a binary system compound, a ternary or more multi-system compound, or a solid solution between a binary system compound and a ternary or more multi-system compound.

10 Claims, 5 Drawing Figures

FIBER FOR OPTICAL TRANSMISSION HAVING SINGLE CRYSTAL CORE

BACKGROUND OF THE INVENTION

This invention relates to an optical fiber for use as a transmission line in optical communications.

A fiber heretofore proposed for optical transmission is a glass fiber which is formed of glass consisting principally of silicon dioxide ($SiO_2$) and has a concentric structure comprising a core for propagating light and a cladding of a little lower refractive index than the core. The glass fiber for optical transmission is divided into a quartz glass fiber in which additives such as $GeO_2$, $P_2O_5$, $B_2O_3$, etc. are contained in quartz glass of the principal component for the purpose of changing its refractive index, and a multi-component glass fiber which contains several kinds of components such as alkali oxides in addition to $SiO_2$. In either case, the $SiO_2$ glass is used as a principal material. Of the conventional fibers, although the quartz glass fiber has the smallest transmission loss, the transmission loss is not so reduced in practice in the long-wavelength band.

SUMMARY OF THE INVENTION

An object of this invention is to provide a fiber for optical transmission which is free from transmission loss, except by Rayleigh scattering, and which has a very small transmission loss in long-wavelength bands, also in the near infrared and the infrared regions.

In accordance with this invention, there is provided a fiber for optical transmission, in which a core thereof for propagating light is formed of a single crystal of an ionic substance except positive ions having no closed cell electronic structure and positive ions of strong covalency. The ionic substance is a binary system compound, a ternary or more multi-system compound, or a solid solution between a binary system compound and a ternary or more multi-system compound.

BRIEF DESCRIPTION OF THE DRAWINGS

This invention will be described with reference to the accompanying drawings, in which.

DESCRIPTION OF THE PREFERRED EMBODIMENTS

Figure 1:
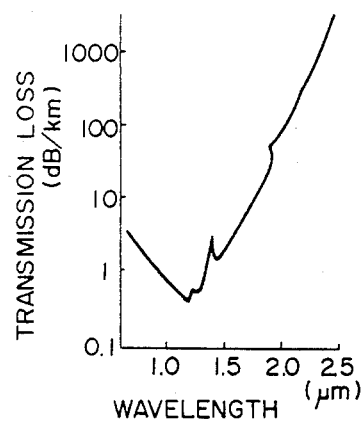
FIG. 1 is a characteristic diagram showing a transmission loss characteristic as a function of wavelength for a conventional quartz glass fiber.

As shown in FIG. 1, the most important factor of the transmission loss is in the short-wavelength band, the Rayleigh scattering which is caused by density fluctuation due to thermal fluctuation of constituent atoms of the glass. But, this scattering is in inverse proportion to the fourth power of the wavelength of light, and hence ought to be negligible theoretically in the long-wavelength band. In the long-wavelength band, however, there occur not only a great absorption of light by $SiO_4$ tetrahedrons at wavelengths in the vicinity of 9 $\mu$m but also an appreciable absorption of light at wavelengths in the neighborhood of 2.73 $\mu$m by OH radicals contained in the quartz glass. Accordingly, in the long-wavelength band, the transmission loss is not reduced in practice. With the prior art glass fibers, the transmission loss is minimized at a wavelength of 1.3 $\mu$m at which the total transmission loss by the both type absorptions of light is minimized; but in this case, the transmission loss is still as large as 0.5 dB/km.

In the conventional glass fiber consisting principally of quartz, the cause of transmission loss by the absorption of light in the long wavelength region can be considered as follows: That is, since the conventional glass fiber is made of such a covalent substance as $SiO_2$, there exists in the fiber material itself the infrared absorption which originates from oscillation between such bonded atoms as Si-O and Si-Si. On top of that, silicon which exhibits strong covalency has a property that it is liable to be bonded to a free radical of an impurity such as an OH radical, and its absorption spectrum is also added; therefore the transmission loss cannot be reduced even in the wavelength band where the transmission loss by the Rayleigh scattering decreases. THe use of glass as a fiber material inevitably involves the use of a vitrifiable substance, that is, a covalent substance such as $SiO_2$, $B_2O_3$ or the like, and the abovesaid defect of the prior art is essentially unavoidable in the glass fiber.

To overcome such a defect of the conventional glass fibers, it is necessary to employ, as the material of the fiber itself, a non-covalent substance, that is, an ionic substance. The ionic substance is not essentially vitrifiable, so that the fiber must be formed of a polycrystal or single crystal. In a case of employing the polycrystal, however, a grain boundary exists between fine crystals and the transmission loss is increased by the scattering of light in the grain boundary, resulting in a failure to achieve the object. Accordingly, it is necessary to produce a fiber which has no grain boundaries, that is, a fiber which has a monocrystalline core. Besides, even in a case of an ionic substance, if it contains an element with no closed cell electronic structure such as a transition metal element, the absorption of light is caused by an electron transition in a region of ultraviolet rays or a visual rays of light, so that such an element with no closed cell electronic structure is not suitable for use as a fiber material. Therefore, in order to obtain a fiber which is low in transmission loss in the longwavelength region of the wavelength regions of near infrared radiation and infrared radiation, a core 11 of the fiber of this invention, shown in FIG. 2, must be formed of single crystals of an ionic substance except those of positive ions having no closed cell electronic structure and positive ions of strong covalency.

As such a core material, there is (1) a binary system compound, which includes (a) halides of alkali metals such as LiF, KCl, KBr, KI, NaF, NaCl, CsBr, CsI, etc., (b) halides of alkaline earth metals such as $MgF_2$, $CaF_2$, $CaCl_2$, $SrF_2$, $BaF_2$, etc., (c) oxides of alkaline earth metals such as MgO and so on, (d) oxides of those of the Group IV elements which become positive ions having the closed cell electronic structure, such as $TiO_2$, and (e) oxides of those of the Group III elements which exhibit a large ionic strength, such as $Al_2O_3$, $Ga_2O_3$, etc.

Further, (2) ternary system and multi-system components usable as the core material are oxides of ternary and multi-system compounds which are each composed of a combination of at least two of an alkali metal, an alkaline earth metal, one of those Group IV elements which become positive ions of the closed cell electronic structure and one of those Group III elements which have a large ionic strength, such as, for example, MgAl$_2$O$_4$, SrTiO$_3$ and BaTiO$_3$.

Moreover, solid solutions between the compounds (1) and (2) defined above may also be used.

Figure 2:
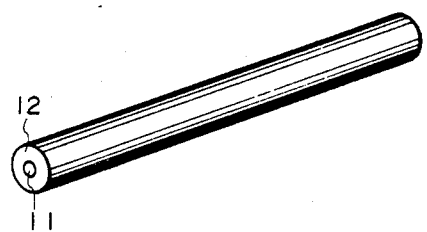
FIG. 2 shows the external appearance of a fiber for optical transmission according to this invention.

A cladding 12 shown in FIG. 2 is formed by diffusing an impurity into a monocrystalline core material to provide a slightly decreased refractive index, or by covering the core with a material whose refractive index is lower than that of the core, such as quartz glass, multi-component glass consisting of SiO$_2$ and other components, B$_2$O$_3$ glass or like glass material, or a plastic or like high molecular material. In a case of forming the cladding by impurity diffusion, it is possible to produce any of the single mode, graded index and step index type fibers.

As described above, the fiber for optical transmission according to this invention has its core made of ionic crystal. Accordingly, it is possible to remove the absoprtion loss due to oscillation between bonding atoms as in such a covalent substance as SiO$_2$. Moreover, since the ionic crystal is not susceptible to chemical bonding to an impurity functional group such as an OH group, the fiber can be fabricated without such an impurity functional group, and consequently the transmission loss can also be avoided which originates from the inclusion of the impurity functional radical. Besides, since the core single crystals are linear single crystals, no grain boundaries exist as in a case of glass and no transmission loss is caused by the light scattering in the grain boundaries. Accordingly, it is possible to obtain a fiber for optical transmission which is very low in transmission loss not only in the wavelength bands of visible and near infrared radiation but also in the wavelength bands of infrared and far infrared radiation.

Figure 3:
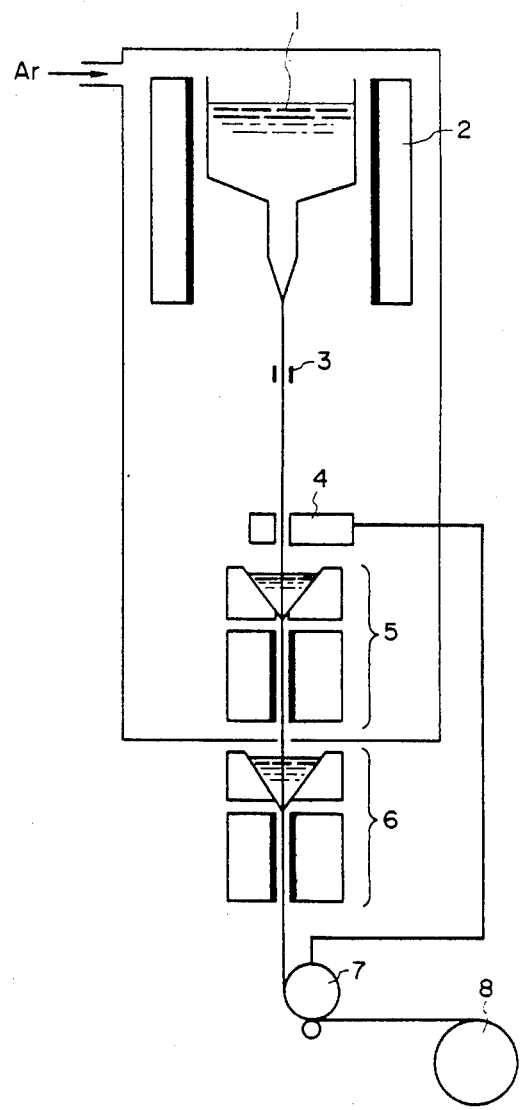
FIGS. 3 and 4 are system diagrams illustrating examples of manufacturing apparatus for the optical fiber of this invention.
Figure 4:
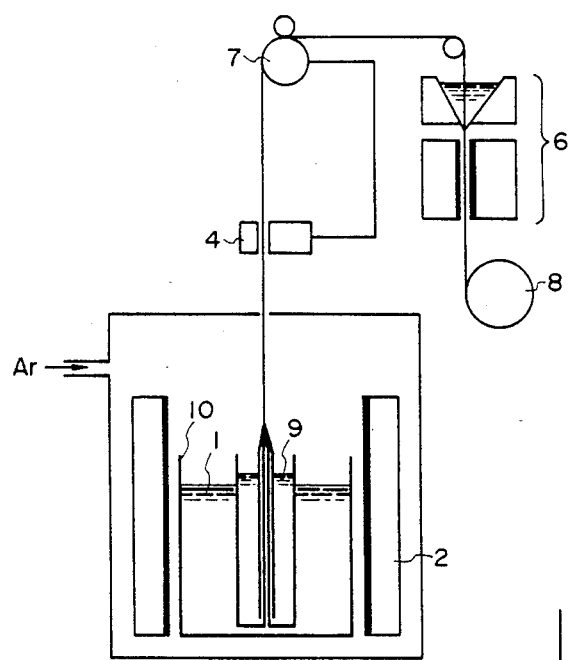

With reference to FIGS. 3 and 4, a description will be given of an example of a method for making the optical transmission fiber of this invention. In FIG. 3, reference numeral 1 indicates a monocrystalline core material; 2 designates a melting furnace; 3 identifies a melting band heater; 4 denotes a core diameter monitor; 5 represents a cladding device; 6 shows a plastic covering device; 7 refers to a pulling device; 8 indicates a reel. The monocrystalline core material 1 is heated by the melting furnace 2 to be molten and then supplied from a nozzle to the melting band heater 3, by which the core material 1 is made monocrystalline. The core diameter is detected by the core diameter monitor 4 at all times, and the detected output is fed back to the pulling device 7 to control the pulling speed, thereby to maintain the core diameter constant. After passing through the melting band heater 3, the monocrystalline core is covered with a cladding by the cladding device 5 and then sheathed by the plastic covering device 6, thereafter being taken up on the reel 8. The monocrystalline core material 1, the melting furnace 2, the melting band heater 3, the core diameter monitor 4 and the cladding device 5 are placed in an Ar gas atmosphere so as to avoid contamination with an impurity.

Figure 5:
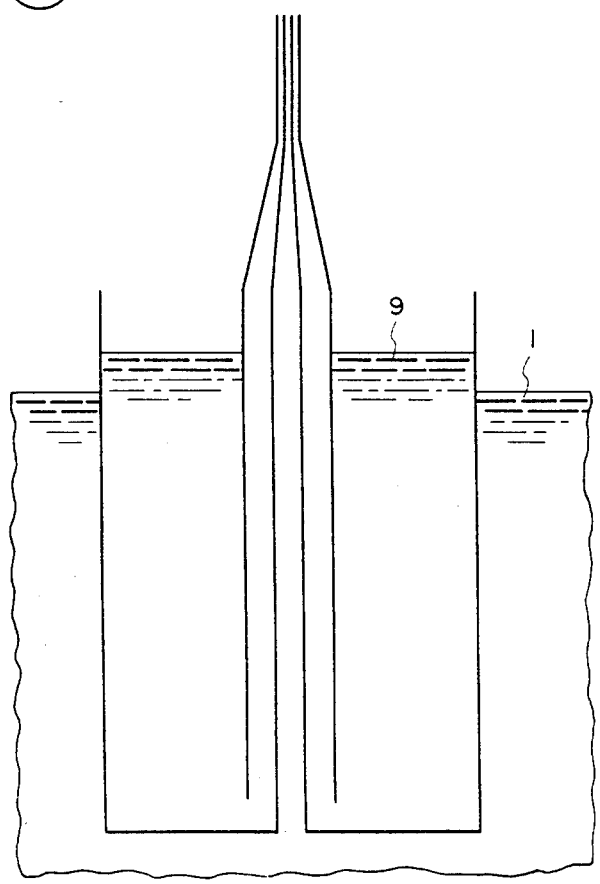
FIG. 5 is an enlarged diagram showing the interior portion of the apparatus depicted in FIG. 4.

In FIG. 4, reference numeral 1 indicates a monocrystalline core material; 2 designates a melting furnace, which can be given a proper temperature gradient; 9 identifies a cladding material; 4 denotes a rod diameter monitor; and 10 repesents a double crucible for containing the core material 1 and the cladding material 9, which crucible is constructed in such a configuration that the cladding material 9 is caused by a double capillary structure to cover the core material. Reference numeral 6 shows a plastic covering device; 7 refers to a pulling device and 8 indicates a reel. The core material 1 and the cladding material 9 molten by the melting furnace 2 are pulled out in the form of a rod from the tip of the double capillary while being attached to a seed crystal. At this time, by suitably selecting the temperature gradient and the pulling speed, the core or the cladding are made monocrystalline and the core-cladding structure is formed. The rod diameter is fed by the rod monitor 4 back to the pulling speed and held constant, and the rod is taken up on the reel after being covered with a plastic material. The core material 1 and the melting furnace 2 are held in an Ar gas atmosphere so as to avoid contamination with an impurity. FIG. 5 is an enlarged diagram showing the interior of the melting furnace utilized in FIG. 4.

As has been described above, the optical transmission fiber of this invention does not contain any impurities such as OH radicals and so on, and hence has a very small transmission loss. Accordingly, the use of the optical fiber as a transmission line for long-distance optical communication enables the reduction of the number of repeaters for signal amplification, providing an optical communication system which is simple and inexpensive, and has a large-capacity. Further, the optical fiber of this invention is suitable for various uses as an optical energy transmission line and a transmission line for an optical information system as well as a transmission line for an optical communication system.

What we claim is:

1. A fiber for optical transmission, including a drawn single crystal core for propagating light formed by drawing a crystal melt through a nozzle to form a single crystal of an ionic substance except positive ions having no closed cell electronic structure and positive ions of strong covalency, and said drawn single crystal core of an ionic substance having a very low transmission loss at wavelengths in the infrared regions.

2. A fiber for optical traansmission according to claim 1, wherein the ionic substance is a binary system compound.

3. A fiber for optical transmission according to claim 2, wherein the binary system compound is a halide of an alkali metal such as LiF, KCl, KBr, KI, NaI, NaCl, NaF, CsBr, CsI or the like.

4. A fiber for optical transmission according to claim 2, wherein the binary system compound is a halide of an alkaline earth metal such as MgF$_2$, CaF$_2$, CaCl$_2$, SrF$_2$, BaF$_2$ or the like.

5. A fiber for optical transmission according to claim 2, wherein the binary system compound is an oxide of an alkaline earth metal such as MgO.

6. A fiber for optical transmission, including a single crystal core for propagating light formed of a single crystal of an ionic substance except positive ions having no closed cell electronic structure and positive ions of strong covalency, said single crystal core of an ionic substance having a very low transmission loss at wavelengths in the infrared regions, and said ionic substance being a binary system compound which is an oxide of one of the Group IV elements which developes positive ions of closed cell electronic structure, such as TiO$_2$.

7. A fiber for optical transmission, including a single crystal core for propagating light formed of a single crystal of an ionic substance except positive ions having no closed cell electronic structure and positive ions of strong covalency, said single crystal core of an ionic substance having a very low transmission loss at wavelengths in the infrared regions, and said ionic substance being a ternary or more multi-system compound.

8. A fiber for optical transmission according to claim 7, wherein the multi-system compound is composed of a combination of two of an alkali metal, an alkaline earth metal, one of those Group IV elements which become positive ions of closed cell electronic structure and one of those Group III elements which have a large ionic strength.

9. A fiber for optical transmission according to claim 8, wherein the multi-system compound is any one of $MgAl_2O_4$, $SrTiO_3$ and $BaTiO_3$.

10. A fiber for optical transmission, including a single crystal core for propagating light formed of a single crystal of an ionic substance except positive ions having no closed cell electronic structure and positive ions of strong covalency, said single crystal core of an ionic substance having a very low transmission loss at wavelengths in the infrared regions, and said ionic substance being a solid solution between a binary system compound and a ternary or more multi-system compound.

* * * * *